Aug. 24, 1965 G. F. FRANK 3,202,907

POWER AMPLIFIER

Filed May 25, 1961

Inventor:
Gerald F. Frank,
by Irving H. Marshman
Attorney.

3,202,907
POWER AMPLIFIER

Gerald F. Frank, Bloomington, Ill., assignor to General Electric Company, a corporation of New York Filed May 25, 1961, Ser. No. 112,568
5 Claims. (Cl. 323—89)

Figures 1, 2:
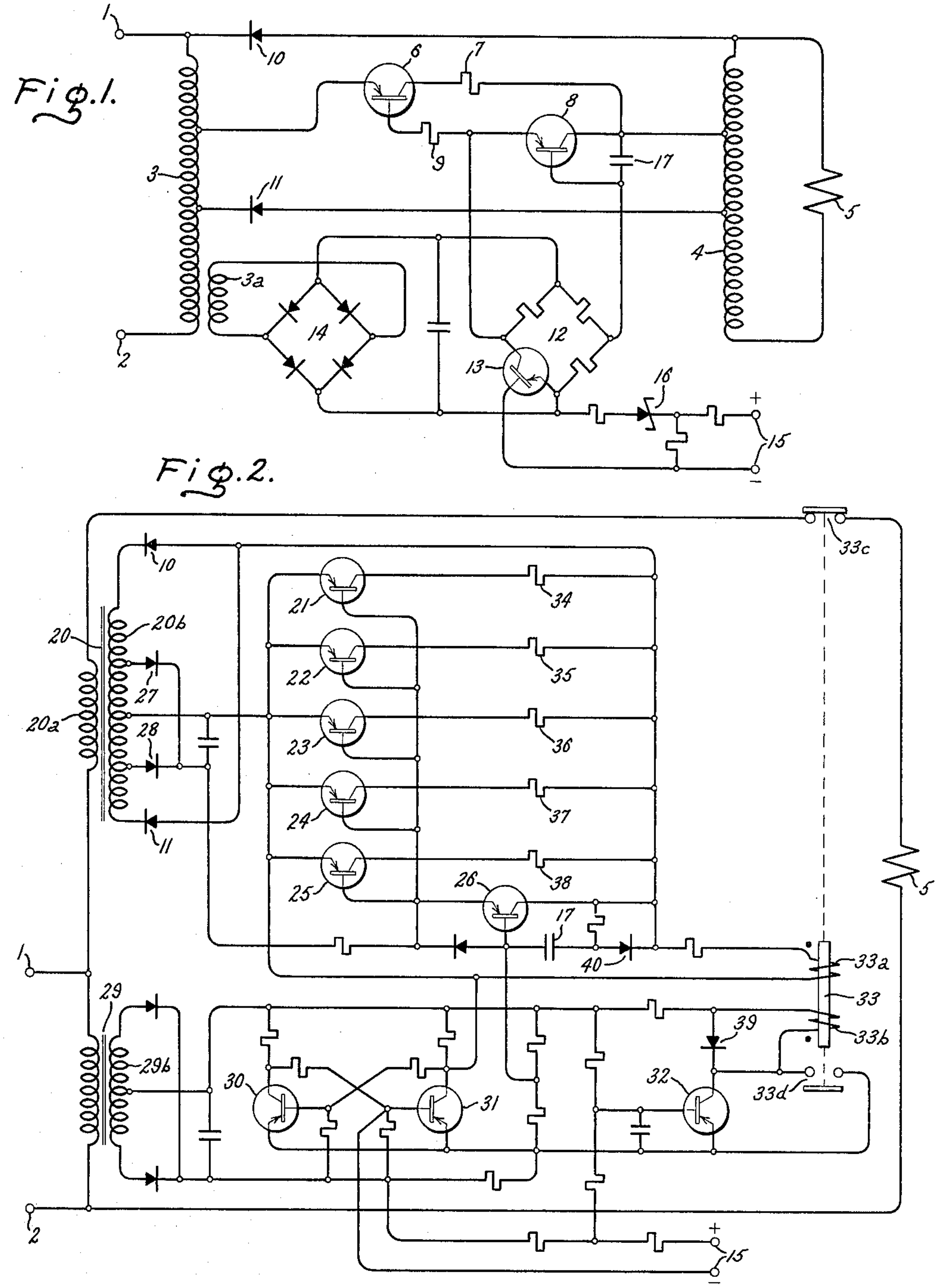

This invention relates to amplifiers, and more particularly to amplifiers employing transistors, and it has for an object the provision of a simple, reliable, improved and inexpensive device of this character. More particularly, the invention relates to transistor power amplifiers for use on A.-C. loads, and a further object of the invention is the provision of a transistor power amplifier for switching variable power factor A.-C. loads.

A still further object of the invention is the incorporation in a transistor power amplifier of fast response without introducing harmful switching transients.

One of the problems encountered in switching A.-C. loads with transistors is the out-of-phase relationship of the transistor load current to the transistor bias current that results in the switching of variable power factor loads. This interferes with proper transistor saturation and accordingly, a further object of the invention is the provision in a transistor power amplifier of means for effectively maintaining the transistor bias current in phase with the load current.

Still another problem encountered in transistor switching of an A.-C. inductive load is that of high voltage transients, and a further object of the invention is the provision in a transistor power amplifier of this character of means for preventing or greatly reducing such surges.

Another problem present in a transistor power amplifier is the failure of one or more of the transistors. A transistor failure usually results in loss of its property of being able to stand off voltage, and the loss of this property causes it to lose its resistance and to act as a short circuit. Thus it will act as though turned on when its control is actually calling for it to be turned off; consequently such a failure could result in injury to operating personnel and in severe damage to the apparatus controlled by the amplifier. Accordingly, a further object of this invention is the provision in a transistor power amplifier of means for preventing the failure of one or more transistors from causing the amplifier to energize its load circuit; in other words a further object of this invention is to cause the amplifier to "fail-safe."

In carrying the invention into effect in one form thereof, a rectified voltage is supplied to the main conducting path of a first transistor. Bias control for this transistor is provided in the form of a second transistor having its main conducting path included in a circuit connection between the base of the first transistor and one of its collector and emitter electrodes. Included in the main conducting path of the first transistor is a relatively low resistance device which in conducting the current of the main conducting path produces sufficient self-bias to keep the first transistor properly saturated.

A further aspect of the invention involves the connection of an energy-storage device in the bias circuit of the second transistor to retard the decay of bias current sufficiently to prevent overvoltage switching transients.

In still another aspect of the invention, means responsive to the relationship of the voltage across the transistor to a signal input to the transistor to prevent the amplifier from supplying output to its load when such output is not being called for by the signal, is provided for the purpose of rendering the amplifier "fail-safe" upon a failure of one or more of the transistors in the amplifier.

For a better and more complete understanding of the invention reference should now be had to the following specification and to the accompanying drawings of which FIG. 1 is a simple schematic diagram of an embodiment of the invention, and FIG. 2 is a simple diagrammatic sketch in elementary form of a preferred form of the invention.

Referring now to the drawings and particularly to FIG. 1 thereof, alternating current is supplied to the input terminals 1 and 2 of the amplifier from a suitable source, such for example as a commercial 115 volt 60 cycle source. A transformer 3 steps down the voltage to an appropriate level that is determined by the rating of the transistors that are employed in the amplifier. A similar transformer 4 steps up the output voltage to an appropriate level, e.g., 115 volts. Although the transformers 3 and 4 may be of any suitable type, they are illustrated as auto transformers. The load 5 which is supplied from the transformer 4 may be any variable power factor A.-C. load such as solenoid or motor starter.

A main transistor 6 is connected to the secondary winding of transformer 3 in a center tap configuration. Similarly the primary winding of the output transformer is connected to the main transistor 6 in a center tap configuration. In this connection the emitter of the transistor is connected to the center tap of the secondary winding of the input transformer 3, and the colletcor is connected to the center tap of the primary winding of the output transformer. The secondary winding of the output transformer 4 is connected to end terminals constituting load terminals across which the load 5 is connected. Included in the collector circuit is a resistor 7 of relatively low resistance. For example, assuming the transistor 6 to be a Delco 2N277 with its emitter connected to a 23 volt tap on the secondary winding of transformer 3, the resistance of resistor 7 may appropriately be .05 ohm.

Included in the base circuit of transistor 6 is a second transistor 8. As shown, its emitter is connected through a resistor 9 to the base of the main transistor 6, and its collector is connected to the common terminal of resistor 7 and the mid tap of the output transformer primary winding.

Diode rectifiers 10 and 11 are included in return current paths from the end terminals of the primary winding of the output transformer 4 to the end terminals of the secondary winding of the input transformer 3 to provide unidirectional current for the transistors 6 and 8.

The switching of the second transistor 8 is accomplished by suitable means, such for example as the bridge network 12 having a third transistor 13 included in one of its legs. An isolated secondary winding 3*a* provides voltage of appropriate value for transistor 13. This voltage is full wave rectified by the bridge rectifier 14, and supplied to the input terminals of the bridge network 12 of which the output terminals are connected to the emitter and base of the second transistor 8.

A switching signal in the form of an electrical quantity is derived from a suitable source, such for example as the output of a logic system, and is supplied to the base and emitter of the bridge transistor 13 by means of suitable input connections 15 in which a Zener diode 16 is included.

In the off state of the amplifier, a small input may be supplied to the bridge transistor 13 through the Zener diode; however, since this small voltage is insufficient to switch the diode, no biasing potential is supplied to the bridge transistor 13, and zero bias current flows in the emitter base circuit of this transistor. In the absence of bias, transistor 13 is a high impedance in the bridge circuit in which it is connected. As a result, the bridge network is heavily unbalanced and applies a reverse bias to transistor 8; i.e., the voltage supplied to the base of transistor 8 is positive with respect to the voltage applied to its emitter. With a reverse bias, transistor 8 presents a very high impedance in series with the base of the main transistor 6.

Without forward bias, the main transistor 6 is a high impedance in series with the primary winding of the output transformer so that substantially all of the output voltage appears across transistors 6 and 8, and practically none of it appears across the output transformer. Under these conditions, the load has little or no voltage, and the power amplifier is considered to be in the turned-off state.

An increase to a predetermined substantial value in the voltage supplied to the transistor 13 causes the Zener diode 16 to break down and become conducting, and as a result, transistor 13 receives forward bias current and presents a low impedance in its arm of the bridging network. This swings the reverse bias of transistor 8 first to zero bias and then through zero bias to forward bias. With forward bias current, transistor 8 presents a relatively low impedance in series with the base of transistor 6. Bias current now flows in the base circuit of transistor 6 causing it to present a relatively low impedance in series with the output transformer. At this point very little voltage is across the transistor, and substantially all of the secondary voltage of input transformer 3 now appears across the output transformer. The load current quickly snaps to full value and thus is quickly switched from the no-load to the full-load condition.

The load current through the small resistance 7 in series with the collector of the transistor 6 and through the saturation resistance of the transistor 6 itself produces sufficient self-bias to maintain transistor 6 properly saturated. As will be noted, in this configuration the bias current is entirely dependent on the load current through the emitter-collector path of transistor 6 both in amplitude and in phase, completely regardless of the type of load on the amplifier.

For the purpose of retarding the rate of decay of the bias current when the amplifier is switched from the on state to the off state, a capacitor 17 is connected from the base to collector of transistor 8. Since a capacitor can neither be charged nor discharged instantaneously, this capacitor substantially prevents overvoltage switching transients.

In the preferred modification of FIG. 2, the primary winding 20*a* of a transformer-reactor 20 is connected in series with the load 5 across the power input terminals 1 and 2. This primary winding is proportioned to be capable of standing off the line voltage at a minimum of magnetizing current.

To the center tapped secondary winding 20*b* of the transformer-reactor is connected the final stage of a three-stage transistor amplifier. This final stage is illustrated as a plurality of transistors 21, 22, 23, 24, and 25 connected in parallel. The number of such transistors connected in parallel could be either greater or less than the number shown, depending upon the load and the ratings of the transistors. The transformer 20 steps down the line voltage to the appropriate transistor working voltage, and rectifiers 10 and 11 provide D.-C. voltage for the parallel transistors 21–25 inclusive of the third or last stage and for transistor 26 of the second stage. Diodes 27 and 28 constitute part of a D.-C. negative feedback voltage for the final stage.

A transformer 29 supplies voltage of appropriate magnitude for the first or preamplifier stage which includes transistors 30 and 31. These two transistors and their associated circuitry components constitute an unbalanced bistable flip-flop network for snap action operation in response to a predetermined value of initiating signal in the form of an electrical quantity supplied to connections 15. Transistor 32 and suitable means controlled thereby, such for example as relay 33, constitute a fail-safe circuit for protecting the amplifier and the load controlled thereby against the failure of one or more of the transistors in the third stage which would result in a short circuit of a faulted transistor and the entire third stage. This relay is illustrated as a two-winding relay having one of its operating coils 33*a* connected across the parallel transistors 21, 22, 23, 24 and 25, and having its other coil 33*b* supplied from the secondary winding 29*b* of transformer 29. Resistors 34, 35, 36, 37 and 38 are connected in series relationship in the collector circuits of transistors 21, 22, 23, 24, and 25 respectively for the purpose of providing self-bias for each of these transistors.

In operation, with negligible output from the source of signal quantity, the amplifier is in the off state. Transistor 30 of the bistable flip-flop network is biased "on," and transistor 31 is biased "off." Under this condition, the bases of the third stage transistors 21, 22, 23, 24 and 25 are positive with respect to their emitters. In other words these transistors are reverse biased and are therefore turned off. Consequently these third stage transistors present a relatively high impedance in series with the secondary winding 20*b* of the transformer-reactor 20. This relatively high impedance is reflected in the primary circuit, and consequently relatively small load current in addition to the magnetizing current of transformer 20 is flowing owing to the high impedance presented by the transformer-reactor 20. With the line voltage appearing mostly across the primary of transformer 20, maximum feedback voltage is applied through diode rectifiers 27 and 28 to the parallel third stage transistors 21, 22, 23, 24 and 25 to provide an additional reverse bias for high temperature compensation and stabilization. Also, transistor 32 is biased normally on so that current flows in relay winding 33*b*. However, since transistors 21, 22, 23, 24 and 25 are biased off, the resulting high voltage which is now across these third stage transistors supplies current to the other winding 33*a* which is poled to oppose the winding 33*b*. Thus the ampere turns of the two windings cancel each other sufficiently to prevent pick up of the relay.

If one of the third stage transistors should fail and develop a resulting short circuit when the amplifier is in the off stage, the voltage across the output stage would be greatly decreased and the relay would pick up in response to the unbalanced net ampere turns of winding 33*b*. In its picked up position, relay 33 opens its normally closed contacts 33*c* before the load 5 becomes energized, i.e., before the contactor 5 can pick up. Simultaneously, the normally open contact 33*d* closes to seal in the relay so that further operation is prevented until power is interrupted and the faulted transistor is removed and replaced.

If a signal quantity of predetermined magnitude, e.g., a current of 5.5 milliamperes is supplied to the connections 15, the flip-flop network snaps from its first stable operating state to its second stable operating state such that transistor 30 is now biased off and transistor 31 is now biased on. As a result, the reverse bias on the second stage transistor 26 disappears, passes through zero and becomes a forward bias. This forward bias current is sufficient to saturate the second stage transistor 26. This transistor now presents a very low impedance in series with the parallel connected bases of the third stage transistors 21, 22, 23, 24 and 25. As a result, sufficient forward bias current flows in the third stage transistors for proper saturation. In their saturated operating condition, these transistors present relatively low impedance; the secondary winding 20*b* of the transformer-reactor 20 is essentially short circuited and the low impedance of the secondary circuit is reflected in the primary winding. As a result, the reactance of transformer 20 becomes very low and the voltage across the transformer is reduced almost to zero. Substantially all of the line voltage now appears across the load. At the same time the negative feedback voltage from the rectifiers 27 and 28 to the bases of the third stage transistors is reduced substantially to zero. Thus the feedback voltage is inversely proportional to the load voltage. The collector currents flowing through the resistances of the emitter-collector paths of the third stage transistors and through the small resistances 34, 35, 36, 37 and 38 produce sufficient forward self-bias voltage for proper saturation of the third stage transistors. Thus this circuitry configuration produces a self-biasing effect with the bias current completely dependent on the load current both in amplitude and in phase regardless of the type of load on the amplifier. Without self-bias, a highly filtered D.-C. bias supply would be required, capable of providing the total peak bias currents of the final stage transistors. An advantage of this self-bias producing circuitry configuration is that it eliminates an expensive independent bias supply. And a further advantage is that the power waste is greatly reduced since the bias current is actually a part of the load current.

The signal supplied to the connection 15 to switch the amplifier on, simultaneously turns off the transistor 32 thereby causing the current in relay winding 33*b* to decay. However, owing to the decreasing voltage across the third stage transistors in their turned-on state, the voltage supplied to the opposing coil 33*a* of the relay substantially disappears and the net ampere turns excitation of the relay remains substantially unchanged so that the relay remains dropped out.

Diode 39 in parallel with relay winding 33*b* acts as a commutating rectifier to prevent any high voltage transients from appearing on transistor 32 during its switching operations. Should one of the third stage transistors fail, it acts as a short circuit and if this occurs when the amplifier is turned on, the relay 33 remains dropped out. However, as soon as the signal supplied to connections 15 decrease below the previously mentioned predetermined value, the transistor 32 will again turn on and energize the relay winding 33*b*. Simultaneously, the flip-flop network will snap back to its first bistable operating stage and turn off the second and third stage transistors. Owing to the short circuit in the faulted transistor, the voltage across the third stage transistors will remain at low value; consequently the relay coil 33*a* will remain deenergized. Since the opposing coil 33*b* is now energized in response to the turn on of transistor 32, the relay will pick up and open its normally closed contacts 33*c* to interrupt the output connection to the load. Simultaneously it will close its normally open contacts 33*d* to seal in the relay and maintain in its picked up state with the contacts 33*c* open until the supply of power to the amplifier is interrupted and the faulted transistor is removed. Thus it will be seen, that the operation of the fail-safe circuit depends upon the relationship of the voltage across the third stage transistors to the signal quantity that is supplied to the connections 15.

As pointed out in connection with the FIG. 1 embodiment when switching the amplifier from the on state to the off state while carrying an inductive load, there is a possibility of harmful high voltages transiently appearing across the second and third stage transistors. Such transient surges are effectively prevented by means of capacitor 17 which retards the decay of the bias current in the second and third stages which in turn retards the decay of the load current.

A diode 40 is connected in circuit with capacitor 17 and is poled to permit the capacitor to be charged through a low resistance path by the bias current of the second stage transistor 26 when the amplifier is switched from on to off. This diode also prevents the capacitor from discharging on each half cycle of the alternating voltage supplied when the amplifier is in the turned-off state.

Although this invention has been described as embodied in specific circuitry it will be understood that the elements and connections shown and described are merely illustrative, and that the invention is not limited thereto since alterations and modifications will readily suggest themselves to persons skilled in the art without departing from the true spirit of the invention or from the scope of the annexed claims.

What I claim as new and desire to secure by Letters Patent of the United States is:

1. A power amplifier comprising, in combination, a pair of input terminals for receiving an alternating voltage, a pair of output terminals for supplying a load, a transformer having a primary winding connected in series relationship between one of said input terminals and one of said output terminals and having a secondary winding with a center tap connection, a first transistor connected to be supplied from said secondary winding having a control circuit and a main current conducting path controlled thereby, first rectifier means for rectifying the output of said secondary winding and supplying a rectified current to said first transistor, second rectifying means supplied from said secondary winding for supplying a reverse bias current to said first transistor, a second transistor having its main conducting path included in the control circuit of said first transistor, resistance means included in said main conducting path of said first transistor for providing a forward self bias for said first transistor through the main conducting path of said second transistor, and circuit means connecting the main current conducting path of the first transistor between said center tap connection and end terminals of said secondary winding.

2. A power amplifier comprising in combination a pair of input terminals for receiving an alternating voltage, a pair of output termianls for supplying a load, a transformer having a primary winding connected in series relationship between one of said input terminals and one of said output terminals and having a secondary winding with a center tap connection, a first transistor connected to be supplied from said secondary winding having a control circuit and a main current conducting path controlled thereby, first rectifier means for rectifying the output of said secondary winding and supplying a rectified current to said first transistor, a bistable flip-flop circuit network connected to said first transistor and operable in one of its stable operating states to supply a reverse bias to said first transistor and operable in the other of its stable operating states to supply forward bias to said first transistor, second rectifying means for rectifying a portion of the output of said secondary winding and supplying additional reverse bias to said first transistor, a second transistor having its main conducting path included in the control circuit of said first transistor, resistance means included in said main conducting path of said first transistor for providing a forward self bias for said first transistor through the main conducting path of said second transistor, and circuit means connecting the main current conducting path of the first transistor between said center tap connection and end terminals of said secondary winding.

3. A power amplifier comprising in combination a pair of input terminals for receiving an alternating voltage, a pair of output terminals for supplying a load, a transformer having a primary winding connected in series relationship between one of said input terminals and one of said output terminals and having a secondary winding with a center tap connection, a first transistor connected to be supplied from said secondary winding having a base, a collector and an emitter, said first transistor having a control circuit including said base and a main current conducting path controlled thereby and including said emitter and collector, first rectifier means for rectifying the output of said secondary winding and supplying a rectified current to said main conducting path, second rectifying means supplied from said secondary winding for supplying a reverse bias current to said first transistor, a second transistor having its main conducting path included in said control circuit of said first transistor, resistance means included in the collector circuit of said first transistor for providing a forward self bias for said first transistor through the main conducting path of said second transistor, and circuit means connecting the main current conducting path of the first transistor between said center tap connection and end terminals of said secondary winding.

4. A power amplifier comprising, in combination, a pair of input terminals for receiving an alternating voltage, a pair of output terminals for supplying a load, a transformer having a primary winding connected in series relationship between one of said input terminals and one of said output terminals and having a secondary winding with a center tap connection, a first transistor connected to be supplied from said secondary winding having a control circuit and a main current conducting path controlled thereby, first rectifier means for rectifying the output of said secondary winding and supplying a rectified current to said first transistor, a second transistor having its main conducting path included in the control circuit of said first transistor, second rectifying means for rectifying a portion of the output of said secondary winding and supplying a rectified current to said second transistor and a reverse bias to said first transistor, a bistable flip-flop network connected to the base of said second transistor, and to said first transistor and operable in the first of its stable states to supply a reverse bias to said first transistor and operable in the second of its stable states to supply a forward bias to said first transistor, means for supplying a signal to said flip-flop network to cause it to transfer from its first to its second stable state, and circuit means connecting the main current conducting path of the first transistor between said center tap connection and end terminals of said second winding.

5. A power amplifier comprising in combination a pair of input terminals for receiving an alternating voltage, a pair of output terminals for supplying a load, a transformer having a primary winding connected in series relationship between one of said input terminals and one of said load terminals and having a secondary winding with a center tap connection, a source of a signal quantity, a first stage comprising a bistable flip-flop network having an input for receiving said signal quantity and an output, a third stage comprising a first transistor having a control circuit and a main conducting path controlled thereby, a second stage comprising a second transistor, a first rectifying means for rectifying the output of said secondary winding and supplying a rectified current to said first transistor, connections from said network for supplying a reverse bias to said first and second transistors in one of its stable states and a forward bias to said transistors in the other of its stable states, second rectifying means for rectifying a portion of the output of said secondary winding and supplying an additional reverse bias to said first transistor, and circuit means connecting the main current conducting path of the first transistor between said center tap connection and end terminals of said secondary winding.

References Cited by the Examiner

UNITED STATES PATENTS

| | | | |
|---|---|---|---|
| 2,623,176 | 12/52 | Witsenburg et al. | 331—62 |
| 2,956,175 | 10/60 | Bothwell | 307—88.5 |
| 3,075,138 | 1/63 | Croft et al. | 323—60 XR |

SAMUEL BERNSTEIN, *Primary Examiner.*

ROY LAKE, *Examiner.*